United States Patent
Sjöland et al.

(10) Patent No.: US 10,224,940 B2
(45) Date of Patent: Mar. 5, 2019

(54) DIGITAL PHASE CONTROLLED PLLS

(71) Applicant: Telefonaktiebolaget LM Ericsson (publ), Stockholm (SE)

(72) Inventors: Henrik Sjöland, Lund (SE); Staffan Ek, Lund (SE); Tony Påhlsson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/559,658

(22) PCT Filed: Apr. 27, 2015

(86) PCT No.: PCT/EP2015/059071
§ 371 (c)(1),
(2) Date: Sep. 19, 2017

(87) PCT Pub. No.: WO2016/173614
PCT Pub. Date: Nov. 3, 2016

(65) Prior Publication Data
US 2018/0198454 A1 Jul. 12, 2018

(51) Int. Cl.
*H03L 7/081* (2006.01)
*H03L 7/23* (2006.01)
(Continued)

(52) U.S. Cl.
CPC ............ *H03L 7/0814* (2013.01); *H03L 7/081* (2013.01); *H03L 7/0816* (2013.01); *H03L 7/091* (2013.01); *H03L 7/183* (2013.01); *H03L 7/23* (2013.01)

(58) Field of Classification Search
CPC ..... H03L 7/081; H03L 7/0812; H03L 7/0814; H03L 7/0816; H03L 7/0818; H03L 7/091;
(Continued)

(56) References Cited

U.S. PATENT DOCUMENTS 5,212,601 A * 5/1993 Wilson ............... G11B 20/1403
360/44
5,391,996 A 2/1995 Marz
(Continued)

FOREIGN PATENT DOCUMENTS

EP 1085678 A2 3/2001
EP 1274181 A1 1/2003
(Continued)

OTHER PUBLICATIONS

Axholt, A., et al., "A PLL based 12 GHz LO generator with digital phase control in 90 nm CMOS", Analog Integrated Circuits and Signal Processing, vol. 67, No. 3, pp. 309-318, Feb. 24, 2011.
(Continued)

*Primary Examiner* — Patrick C Chen
(74) *Attorney, Agent, or Firm* — Coats & Bennett, PLLC

(57) ABSTRACT

A digital solution for phase control of an output of a phase-locked loop (PLL) (100) is provided to achieve a desired phase shift at the output of the PLL (100). To that end, a fraction of the pulses of a PLL feedback signal are time shifted to achieve a desired average time shift associated with the desired phase shift. As a result, a desired phase shift is generated at the output of the PLL (100), while a desired devisor of the feedback signal is maintained on average. The resulting digital solution provides highly accurate phase control.

6 Claims, 9 Drawing Sheets

(51) Int. Cl.
H03L 7/091 (2006.01)
H03L 7/183 (2006.01)

(58) Field of Classification Search
CPC ......... H03L 7/183; H03L 7/185; H03L 7/187;
H03L 7/189; H03L 7/191; H03L 7/193;
H03L 7/195; H03L 7/23; H03L 7/235
USPC ........................................................ 327/158
See application file for complete search history.

(56) References Cited

U.S. PATENT DOCUMENTS

| | | | |
|---|---|---|---|
| 6,642,758 B1 | 11/2003 | Wang et al. | |
| 7,098,754 B2 | 8/2006 | Humphreys et al. | |
| 7,463,710 B2* | 12/2008 | Walsh | H03L 7/1976 |
| | | | 327/156 |
| 7,893,736 B2 | 2/2011 | Palmer et al. | |
| 8,717,077 B2* | 5/2014 | Panikkath | H03L 7/08 |
| | | | 327/175 |
| 8,810,290 B1 | 8/2014 | Cloutier et al. | |
| 2002/0140512 A1 | 10/2002 | Stockton | |
| 2008/0116949 A1 | 5/2008 | Nair | |
| 2009/0174492 A1 | 7/2009 | Zhang | |
| 2010/0259307 A1 | 10/2010 | Kondou | |
| 2011/0028141 A1 | 2/2011 | Yang et al. | |
| 2011/0043289 A1 | 2/2011 | Wan et al. | |
| 2012/0062297 A1 | 3/2012 | Keaveney et al. | |
| 2012/0223771 A1* | 9/2012 | Zhang | H03L 1/02 |
| | | | 327/586 |
| 2014/0062537 A1 | 3/2014 | Kitsukawa et al. | |
| 2014/0268450 A1* | 9/2014 | Cyrusian | H03K 3/0375 |
| | | | 361/56 |
| 2014/0321515 A1* | 10/2014 | Ponton | H03H 11/20 |
| | | | 375/219 |

FOREIGN PATENT DOCUMENTS

| | | |
|---|---|---|
| FR | 2647986 A1 | 12/1990 |
| GB | 2356989 A | 6/2001 |
| GB | 2469473 A | 10/2010 |
| WO | 2007130750 A2 | 11/2007 |
| WO | 2016150471 A1 | 9/2016 |

OTHER PUBLICATIONS

Axholt, A., et al., "A 60 GHz receiver front-end with PLL based phase controlled LO generation for phased-arrays", Submitted to IEEE Proceedings Asia Pacific Microwave Conference, APMC 2011, Dec. 1, 2011, Melbourne, Australia.

* cited by examiner

DIGITAL PHASE CONTROLLED PLLS

TECHNICAL FIELD

The solutions presented herein relate to Radio Frequency (RF) integrated circuits, frequency synthesizers, Phase-Locked Loops (PLLs), phase noise, beamforming, 5G wireless systems, etc.

BACKGROUND

Wireless systems typically upconvert a baseband signal to a Radio Frequency (RF) signal for transmission, and downconvert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals.

In some cases, stringent requirements are placed on the mixing frequency signal, such as produced by a PLL. For example, it is foreseen that 5G cellular systems will use millimeter waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the outputs of the PLLs. At the same time, beamforming should be supported to increase the range and capacity of the system, which results in a large number of antenna elements. The signal at each antenna element of a beamforming system will have an individual phase shift that controls the beam direction. In some implementations, the beam controlling phase shifts are imposed on the mixing signal. In any event, accurate beamforming requires accurate phase shifts. It is also desirable to be able to program the frequency of the mixing signal to enable the wireless device to operate on different frequency channels and in different bands.

As a result of all of these considerations, there is a need to improve the generation of the mixing frequency signals so as to provide the desired frequency programmability, to provide the desired phase control, and to provide improved phase noise performance, particularly in light of possible future 5G systems.

SUMMARY

The solution presented herein provides a digital solution for phase control of an output of a phase-locked loop (PLL) to achieve a desired phase shift at the output of the PLL. To that end, the solution presented herein shifts a timing, e.g., delays a fraction, e.g., one or more pulses, of a PLL feedback signal so that an average desired time shift associated with the desired phase shift is obtained. As a result, a desired phase shift is generated at the output of the PLL, while a desired devisor of the feedback signal is maintained on average. The solution presented herein therefore does not impact the PLL output frequency, and therefore allows independent control of the PLL output phase and frequency. The resulting digital solution provides highly accurate phase control.

In one exemplary embodiment, a PLL comprises an oscillator, a detector, a feedback path, and a phase control circuit. The oscillator is configured to generate a PLL output signal at an output of the PLL responsive to a reference signal input to the PLL. The detector is configured to compare the reference signal to a feedback signal to control a frequency of the PLL output signal, the feedback signal being derived by the feedback path of the PLL from the PLL output signal. The phase control circuit is operatively connected to the feedback path of the PLL, and is configured to generate a timing control signal responsive to a phase control signal. Application of the timing control signal to the feedback path shifts a timing, e.g., delays, one or more pulses of the feedback signal to generate a desired phase shift at the output of the PLL while maintaining a desired average divisor of the feedback signal.

In another exemplary embodiment, a beamforming system comprises an antenna array, a plurality of radio frequency (RF) front-end circuits, and a frequency control circuit. The antenna array comprises a plurality of antenna elements. Each RF front-end circuit is coupled to one of the antenna elements, where each of the RF front-end circuits comprises a PLL comprising an oscillator, a detector, a feedback path, and a phase control circuit. The oscillator of each PLL is configured to generate a PLL output signal at an output of the PLL responsive to a reference signal input to the PLL. The detector of each PLL is configured to compare the reference signal to a feedback signal to control a frequency of the corresponding PLL output signal, the feedback signal being derived by the feedback path of the corresponding PLL from the corresponding PLL output signal. The phase control circuit of each PLL is operatively connected to the feedback path of the corresponding PLL, and is configured to generate a timing control signal responsive to a phase control signal. Application of the timing control signal to the feedback path shifts a timing of one or more pulses of the feedback signal to generate a desired phase shift at the output of the corresponding PLL while maintaining a desired average divisor of the feedback signal. The frequency control circuit is configured to control a frequency of each of the plurality of PLLs relative to the reference signal.

Another exemplary embodiment comprises a method of controlling a phase at an output of a PLL to achieve a desired phase shift at the output of the PLL. The method comprises generating a PLL output signal at the output of the PLL responsive to a reference signal input to the PLL. The method further comprises comparing the reference signal to a feedback signal in a detector to control a frequency of the PLL output signal, the feedback signal being derived by a feedback path of the PLL from the PLL output signal. The method further comprises generating a timing control signal responsive to a phase control signal, and shifting a timing, responsive to the timing control signal, of one or more pulses of the feedback signal to achieve a desired average time shift to generate a desired phase shift at the output of the PLL while maintaining a desired average divisor of the feedback signal.

Another exemplary embodiment comprises a computer program product stored in a non-transitory computer readable medium for controlling a phase at an output of a PLL to achieve a desired phase shift at the output of the PLL. The computer program product comprises software instructions which, when run on a processing circuit, causes the processing circuit to generate a PLL output signal at the output of the PLL responsive to a reference signal input to the PLL, and compare the reference signal to a feedback signal in a detector to control a frequency of the PLL output signal, the feedback signal being derived by a feedback path of the PLL from the PLL output signal. The software instructions which, when run on the processing circuit, further causes the processing circuit to generate a timing control signal responsive to a phase control signal, and shift a timing, responsive to the timing control signal, of one or more pulses of the feedback signal to achieve a desired average time shift to generate a desired phase shift at the output of the PLL while maintaining a desired average divisor of the feedback signal.

DETAILED DESCRIPTION

Figure 1A:
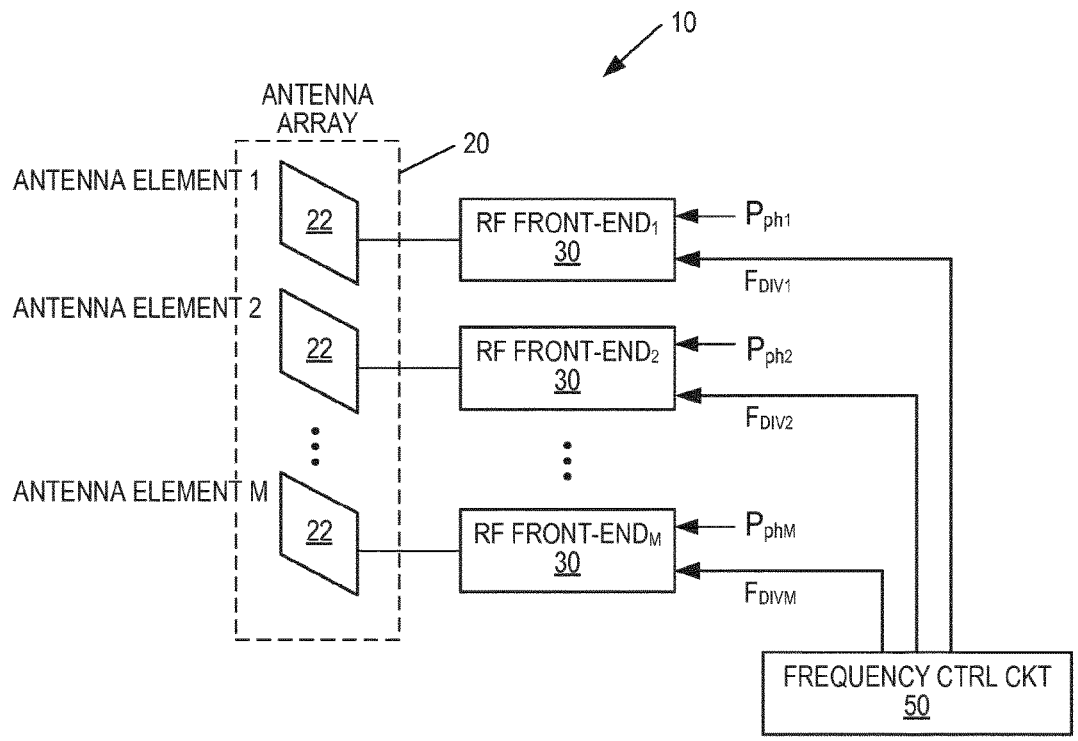
FIG. 1A shows a simplified block diagram of an exemplary beam forming system.
Figure 1B:
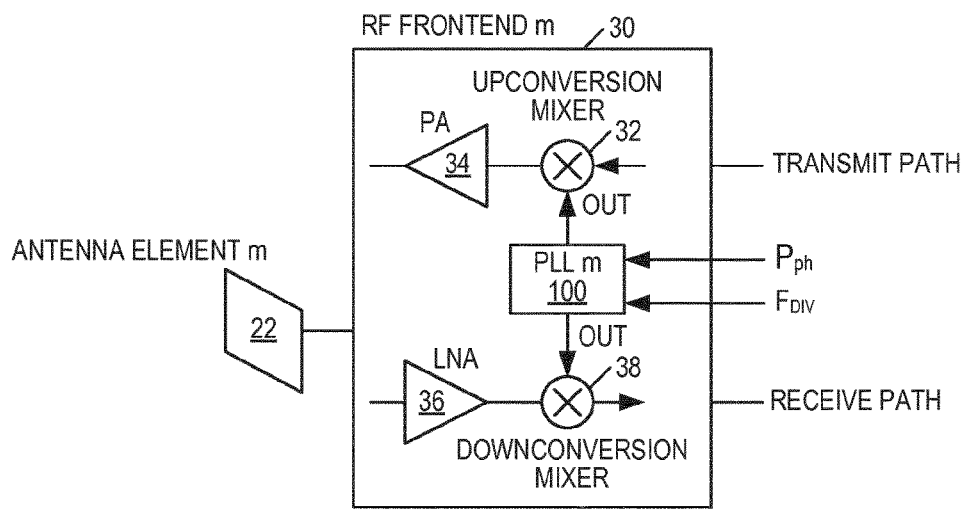
FIG. 1B shows a simplified block diagram of an exemplary RF front-end.

FIG. 1A shows a beamforming system 10 comprising an antenna array 20 with M antenna elements 22, where each antenna element 22 is coupled to a corresponding radio frequency (RF) front-end 30. Each RF front-end 30 comprises a phase-locked loop (PLL) 100 coupled to a transmission path and a reception path, as shown in FIG. 1B. The PLL 100 generates a PLL output signal OUT having specific frequency and phase characteristics, where a phase control signal $P_{ph}$ controls the phase of OUT, and $F_{div}$ controls the frequency of OUT. In some systems, e.g., those employing Frequency Division Duplexing (FDD), two PLLs may be required, where one PLL 100 is coupled to the transmit path and one PLL 100 is coupled to the receive path. For simplicity, however, FIG. 1B only shows one PLL 100. On the transmission side, an upconversion mixer 32 operatively coupled to the output of the PLL 100 upconverts an input signal responsive to the frequency of the output signal supplied by the PLL 100. An amplifier 34, e.g., a power amplifier, amplifies the upconverted signal for transmission by the corresponding antenna element 22. On the receiving side, an amplifier 36, e.g., a low-noise amplifier, amplifies signals received by the corresponding antenna element 22. A downconversion mixer 38 downconverts the amplified signal responsive to the frequency of the PLL output signal. It will be appreciated that FIGS. 1A and 1B show simplified block diagrams of the exemplary beamforming system 10 and RF front-end 30. Other components not pertinent to the discussion have been excluded from the drawings for simplicity.

The PLLs 100 in the RF front-end circuits 30 of an RF system each receive a common reference signal, either directly from a reference oscillator or from a reference PLL. The PLLs 100 then locally multiply the reference signal to a higher (RF) frequency. By using the common reference signal, the output signals of the PLLs 100 will be fixed in frequency and phase with respect to each other. When part of a beamforming system, each PLL 100 can also execute separate phase control, e.g., based on the a phase control signal $P_{ph}$, for beamforming purposes. To control the direction of the beam for the antenna array 20, e.g., the phase of the transmission signal applied to at least some of the antenna elements 22 (or of the reception signal received from at least some of the antenna elements 22) must be accurately controlled. In some systems, for example, digitally controlled current sources are used to inject (analog) current into the loop filters of each PLL 100, which will produce an accurate and linear phase shift of the PLL output signal. However, the current injection solution represents an analog phase control solution. The solution presented herein provides an alternative solution that instead relies on digital phase control, which can further improve the accuracy of the phase control.

The general idea for the solution presented herein is to shift a timing of, e.g., delay, a fraction (e.g., one or more) of the pulses of a PLL feedback signal to achieve a desired average delay. When the PLL feedback signal is, e.g., delayed by some number of output clock cycles, the output phase is advanced by the same number of clock cycles to make sure the PLL 100 remains locked. For example, modulating the delay of the feedback signal so that it is zero 40% of the time and one output clock cycle 60% of the time delays the feedback signal by 0.60 output clock cycles on average. For the PLL to remain locked, the output phase is then advanced by 0.60 clock cycles, i.e., 216°. In another example, delaying a quarter of the pulses of the feedback signal by one cycle results in a 90° phase shift in the PLL output signal. However, this phase shift process does not change the average frequency of the PLL output signal. Thus, delaying a fraction of the pulses of the PLL feedback signal digitally generates a phase shift at the output of the PLL while maintaining a desired average devisor of the feedback signal. Such a digital solution provides highly accurate phase control. Further, such a solution enables independent control of the PLL output frequency and phase.

Figure 2:
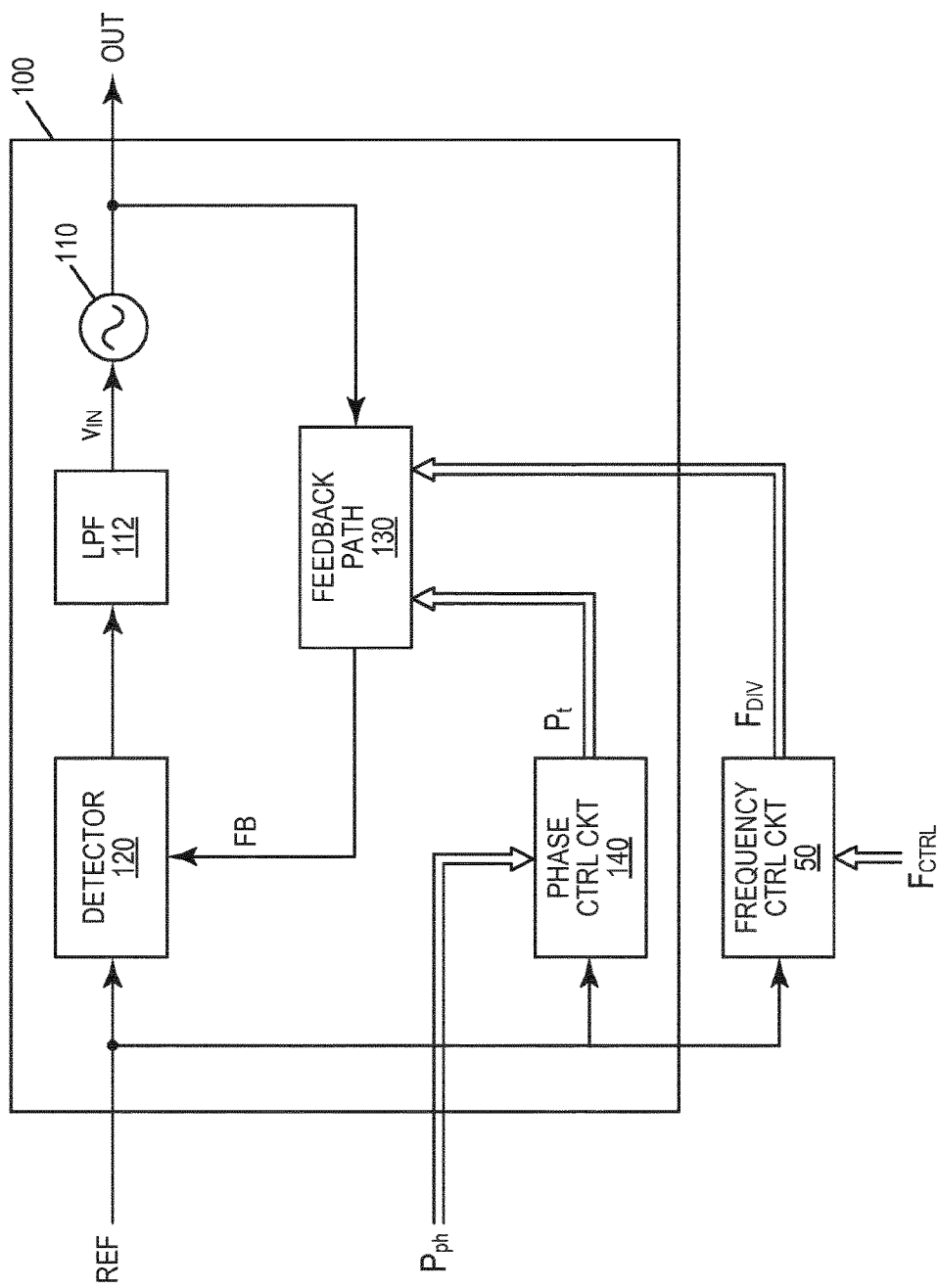
FIG. 2 shows a PLL and frequency control circuit according to one exemplary embodiment.

FIG. 2 shows one exemplary block diagram of a PLL 100 that includes phase control according to the solution presented herein. The PLL 100 comprises an oscillator 110, detector 120, feedback path 130, and phase control circuit 140, and optionally includes a low-pass filter 112 disposed between the detector 120 and oscillator 110. Oscillator 110, which may be programmable and which, in some embodiments, may comprise a voltage-controlled oscillator (VCO) that is programmable, generates an output signal OUT having an output frequency $f_{out}$ at the output of the PLL 100 responsive to a reference signal REF having a reference frequency $f_R$ input to the detector 120. The feedback path 130 generates a feedback signal FB having a feedback frequency $f_{FB}$ from the output signal OUT, e.g., by dividing the output frequency $f_{out}$ by $F_{div}$, where $F_{div}$ may comprise an integer or a rational number and where $F_{div}$ is provided by a frequency control circuit 50. The detector 120 compares the reference frequency $f_R$ to the feedback frequency $f_{FB}$ to generate one or more PLL control signals. The PLL control signal(s) output by the detector 120 may be filtered by filter 112 to generate a filtered signal $v_{in}$. The filtered signal $v_{in}$ is applied to the oscillator 110. When locked, the output signal OUT therefore has a frequency $f_{out}$ that is the average value of $F_{div}$ times the reference frequency $f_R$.

Phase control circuit 140 generates a timing control signal $P_t$ responsive to a phase control signal $P_{ph}$. Application of the timing control signal $P_t$ to the feedback path 130 shifts a timing of, e.g., delays, a fraction of the pulses, e.g., one or more pulses, of the feedback signal FB to generate a desired phase shift in the PLL output signal OUT while maintaining a desired average divisor of the feedback signal FB. The time shifting of the pulses of the feedback signal FB, as discussed herein, refers to how the feedback signal pulses are shifted in time relative to the non-shifted timing of the feedback signal FB. In some embodiments, the feedback signal pulses to be, e.g., delayed are randomly selected. While not required, the phase control circuit 140 comprises a modulation circuit, e.g., a delta-sigma modulator, the use of which enables the low-pass characteristic transfer function of the PLL 100 to attenuate any undesirable high frequency components resulting from the phase control solution presented herein.

Figure 3:
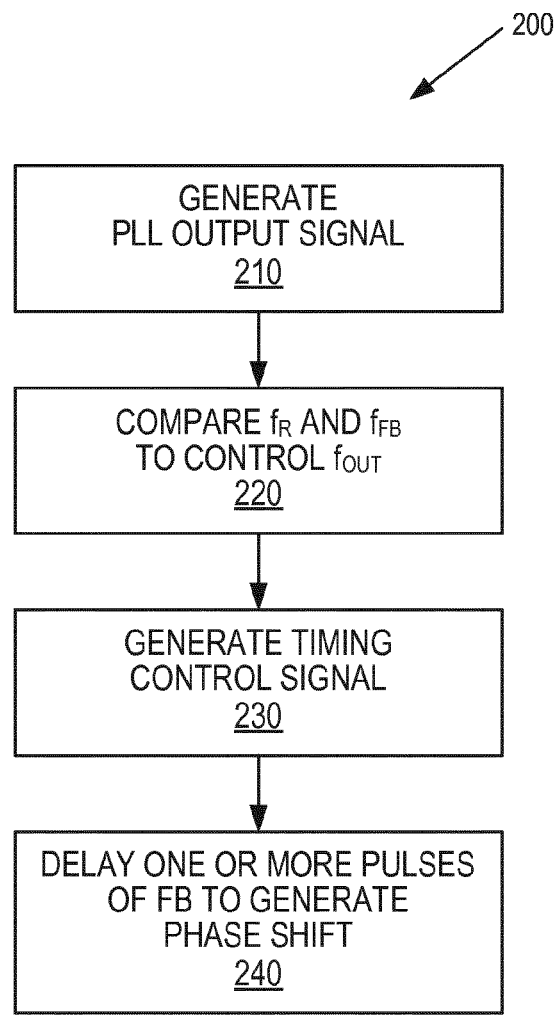
FIG. 3 shows a method for controlling a phase at an output of a PLL according to one exemplary embodiment.

FIG. 3 shows one exemplary phase control method 200 as implemented by the PLL 100. PLL 100 generates the PLL output signal OUT having an output frequency $f_{out}$ at the output of the PLL 100 responsive to a reference frequency $f_R$ of the reference signal REF input to the PLL 100 (block 210). The feedback path 130 of the PLL 100 derives a feedback signal FB having a feedback frequency $f_{FB}$ from OUT, and controls $f_{out}$ based on a comparison between $f_R$ and $f_{FB}$ (block 220). The PLL 100 (phase control circuit 140) generates a timing control signal $P_t$ responsive to a phase control signal $P_{ph}$ (block 230). By applying the timing control signal $P_t$ to the feedback path 130, the PLL 100 shifts a timing of a fraction of the pulses, e.g., one or more pulses, of the feedback signal FB to generate a desired phase shift at the output of the PLL 100 while maintaining a desired average divisor of the feedback signal FB (block 240), and therefore, while maintaining the desired PLL output frequency $f_{out}$. The following presents two exemplary and non-limiting embodiments for shifting the timing of the pulse(s) of the feedback signal. It will be appreciated that the time shifting implemented herein may comprise delaying and/or advancing the pulse(s) of the feedback signal.

Figure 4:
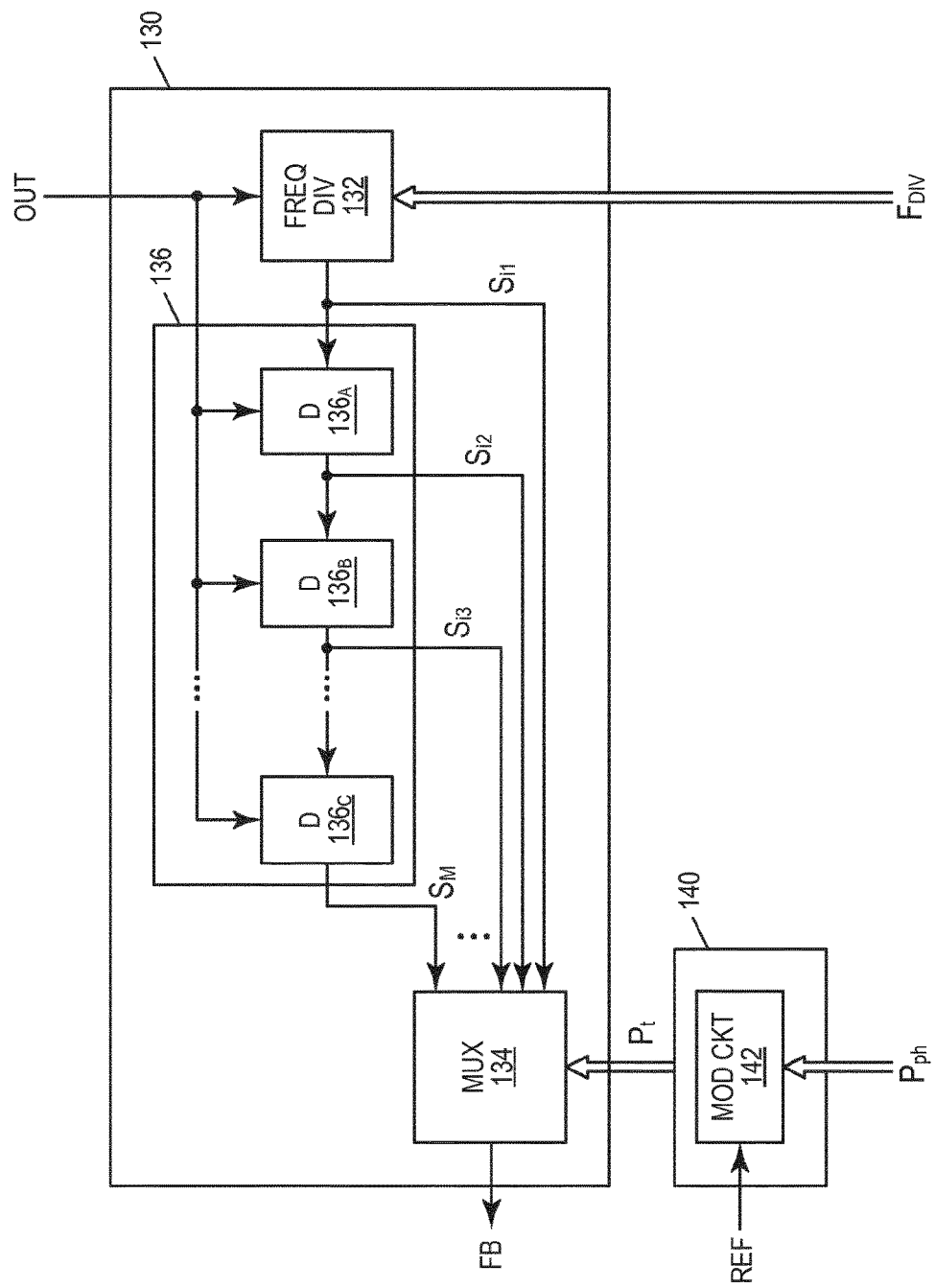
FIG. 4 shows a block diagram of a PLL feedback path and phase control circuit of the PLL of FIG. 2 according to one exemplary embodiment.

FIG. 4 shows a block diagram of the feedback path 130 for the PLL 100 of FIG. 2 according to one exemplary embodiment. In this exemplary embodiment, a direct delay as specified by the timing control signal is applied to the feedback signal to delay the pulse(s) of the feedback signal. To that end, feedback path 130 comprises a frequency divider 132, a multiplexer 134, and a delay line 136. The frequency divider 132 divides the frequency of the PLL output signal OUT by a frequency divisor $F_{div}$ output by the frequency control circuit 50. The delay line 136 comprises a plurality of serially connected delay elements 136A, 136B, 136C, etc. The output of the frequency divider 132 and the outputs of at least some of the delay elements of the delay line 136 are input to the multiplexer 134. The multiplexer periodically selects, responsive to the timing control signal $P_t$, one of the multiplexer inputs as the feedback signal FB. In so doing, the multiplexer 134 controls the delay applied to the feedback signal FB such that only the feedback signal having the desired delay is output by the feedback path 130. For example, multiplexer 134 may select the signal s output from delay element 136B as the feedback signal FB.

It will be appreciated that in some embodiments, the delay line 136 of FIG. 4 may comprise a plurality of delay elements that each sequentially impart a common delay to the input signal. In other embodiments, the delay elements of the delay line 136 may each impart different amounts of delay to the input signal, depending on the desired phase shift options. Further, while FIG. 4 only explicitly shows three delay elements, it will be appreciated that delay line 136 may comprise any number of delay elements.

The phase control circuit 140 for the exemplary embodiment of FIG. 4 may generate any type of timing control signal $P_t$ capable of controlling multiplexer 134. For example, in one embodiment the phase control circuit 140 may comprise a modulation circuit 142, clocked by the reference signal REF, that generates the timing control signal $P_t$ responsive to the phase control signal $P_{ph}$. In general, this timing control signal reduces/increases the feedback divisor during some of the clock cycles to advance/delay the corresponding feedback signal pulse(s).

Figure 5:
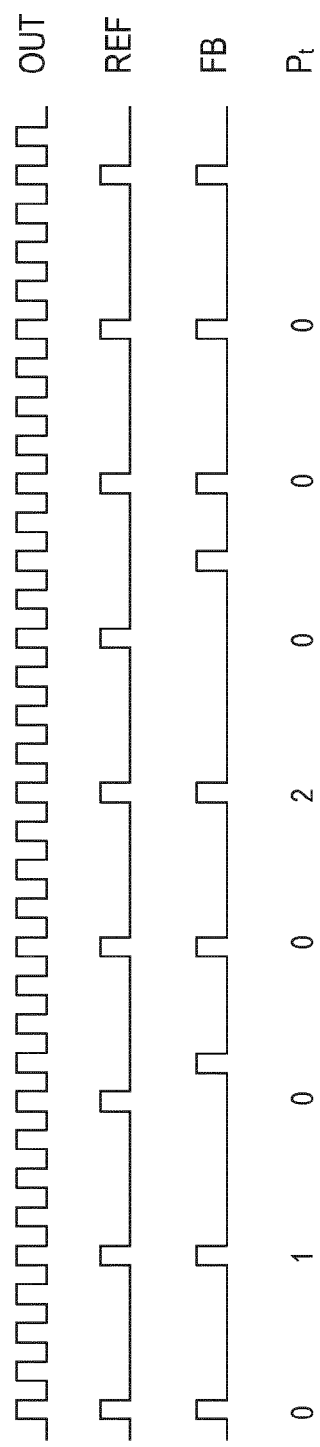
FIG. 5 shows an exemplary signaling diagram for the embodiment of FIG. 4.

FIG. 5 shows an exemplary signaling diagram that encompasses the operation of the general block diagram of FIG. 2, as well as the specific embodiment of FIG. 4. As shown in FIG. 5, as the timing control signal $P_t$ changes, the feedback signal FB also changes, causing a timing difference between the feedback signal FB and the reference signal REF. This timing difference causes a phase shift in the output signal OUT (not shown in FIG. 5 for clarity), while maintaining (on average) the desired output frequency $f_{out}$ in the PLL output signal OUT.

Figure 6:
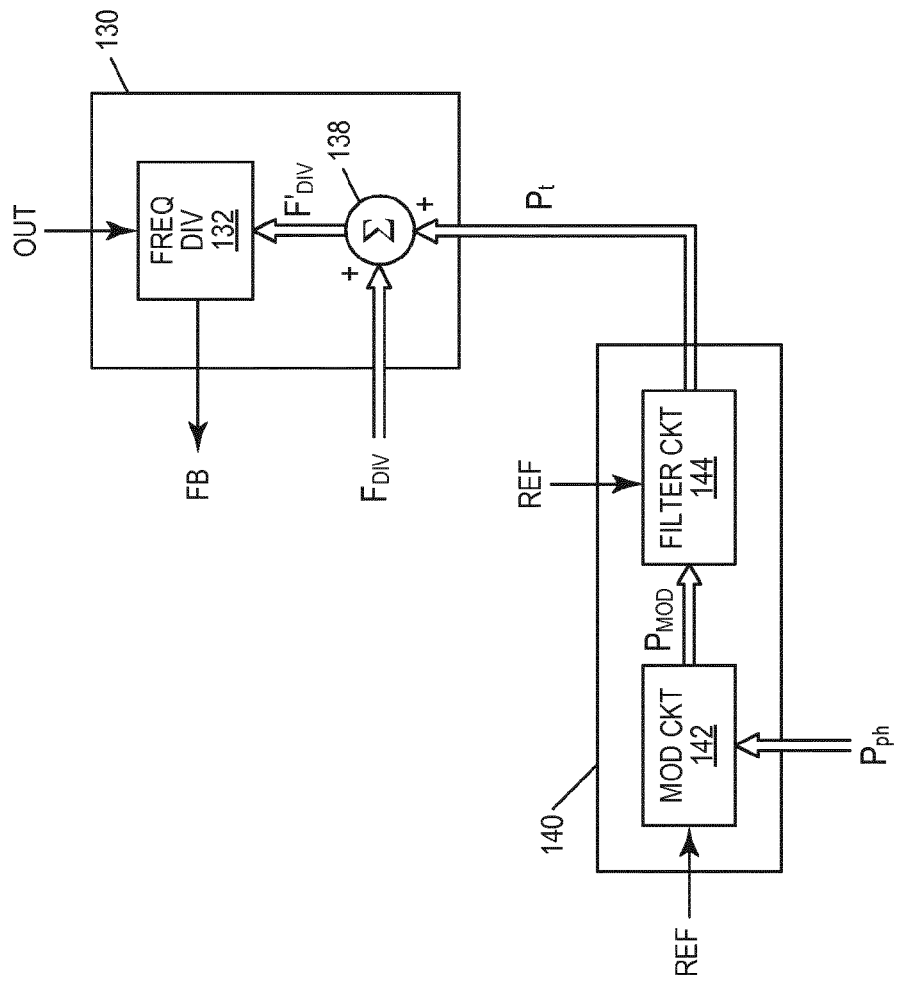
FIG. 6 shows a block diagram of a PLL feedback path and phase control circuit of the PLL of FIG. 2 according to another exemplary embodiment.
Figure 8:
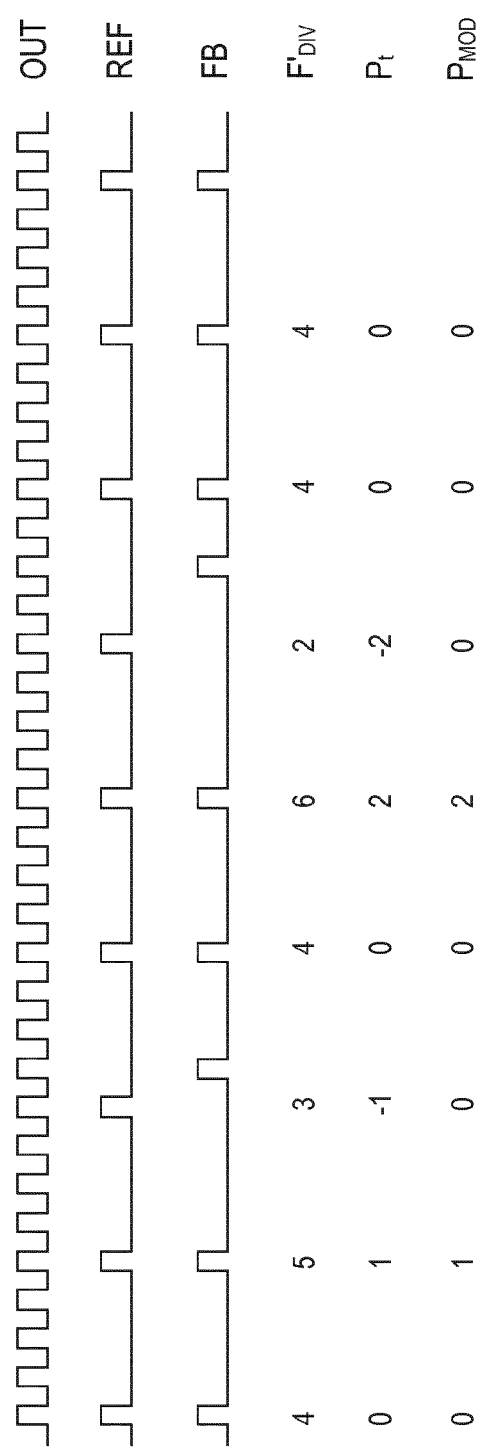
FIG. 8 shows an exemplary signaling diagram for the embodiment of FIG. 6.

FIG. 6 shows a block diagram of the feedback path 130 for the PLL 100 of FIG. 2 according to another exemplary embodiment. In this exemplary embodiment, the timing control signal $P_t$ indirectly controls the delay of the feedback signal pulses by modifying the frequency divisor $F_{div}$. To that end, the feedback path 130 comprises the frequency divider 132 and a combiner 138, e.g., an adder circuit 138, and the phase control circuit 140 comprises the modulation circuit 142 and a filter circuit 144. Modulation circuit 142 generates a modulated output $P_{mod}$ responsive to the phase control signal $P_{ph}$, and the filter 144 filters the modulated output $P_{mod}$ to generate the timing control signal $P_t$. In this embodiment, the timing control signal $P_t$ alters the delay of the feedback signal FB by changing the division number of the frequency divider 132 of the feedback path 130. For example, increasing the frequency divisor $F_{div}$ by one by setting the timing control signal $P_t$ to +1 causes the corresponding pulse of the feedback signal FB to be delayed by one output cycle, as shown in FIG. 8. By subsequently (in the next division cycle) changing the timing control signal $P_t$ to −1, the next feedback signal pulse will occur in its original (unaltered position). The average value of the timing control signal $P_t$ is therefore zero in the embodiment of FIG. 6, unlike in the embodiment of FIG. 4, where the timing control signal $P_t$ is proportional to the desired average delay. Combiner 138 sums the timing control signal $P_t$ with the frequency divisor $F_{div}$ to generate a modified frequency divisor $F_{div}'$. Frequency divider 132 divides OUT by the modified frequency divisor $F_{div}'$ to generate the feedback signal FB. The pulses of the resulting feedback signal FB are delayed by some desired average delay, defined by the timing control signal $P_t$, relative to what the timing of the feedback signal pulses would have been if the frequency divider 132 had used the non-modified frequency divisor $F_{div}$.

Figure 7:
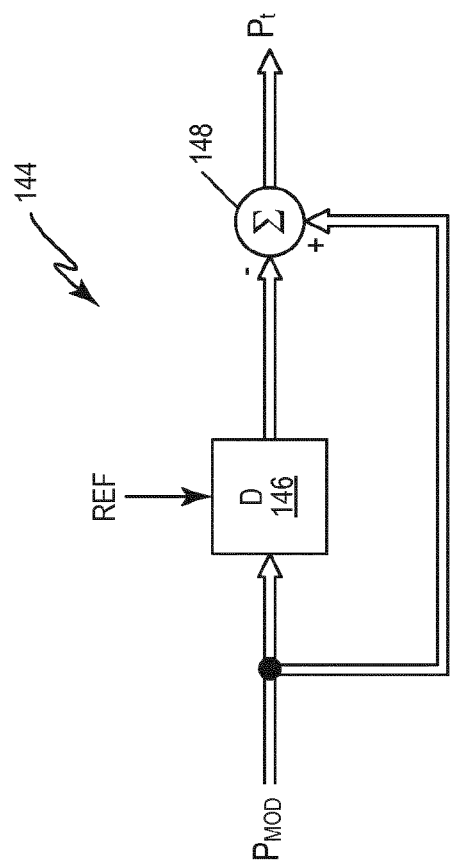
FIG. 7 shows a block diagram of a filter circuit for the phase control circuit of FIG. 6 according to one exemplary embodiment.

In one exemplary embodiment, filter 144 comprises a two-tap Finite Impulse Response (FIR) filter with a zero DC gain, which may be implemented using a delay element 146 and combiner 148, e.g., a subtraction circuit 148, as shown in FIG. 7. The delay element delays the modulated output $P_{mod}$ by one reference cycle to generate a delayed modulated output. Combiner 148 subtracts the delayed modulated output from the modulated output to generate the timing control signal $P_t$. In so doing, the filter 144 follows the advancement/delay of a pulse with a delay/advancement of the distance to the subsequent pulse, e.g., the next pulse will not change its position due to the previous pulse being altered.

FIG. 8 shows an exemplary signaling diagram that encompasses the operation of the general block diagram of FIG. 2, as well as the specific embodiment of FIGS. 6 and 7. In this example, $F_{div}=4$ for each pulse. As shown in FIG. 8, the filtering operation of FIG. 7 creates a timing control signal $P_t$ that indicates how much the distance between each subsequent pulse of the feedback signal FB should be increased or decreased. The modified frequency divisor $F_{div}'$ resulting from adding this timing control signal $P_t$ to the frequency divisor $F_{div}$ therefore momentarily deviates from the desired value of 4 according to the desired phase shift, causing a timing difference between the feedback signal FB and the reference signal REF. This time difference causes a phase shift in the output signal OUT. Because the average frequency divisor is still 4, however, the desired output frequency $f_{out}$ is maintained on average. For example, to delay a pulse of the feedback signal by one cycle, the feedback divisor should be increased by one for one reference clock cycle, and then decreased by one for the next reference clock cycle, as shown in the second and third reference clock cycles of FIG. 8. Similarly, to advance a pulse of the feedback signal by one clock cycle, the feedback divisor should be decreased by one for one reference clock cycle, and then increased by one for the next reference clock cycle. As can be understood from FIG. 8, the solution presented herein may advance/delay the feedback signal pulses by any number of clock cycles, e.g., some number of clock cycles less than $F_{div}$.

Figure 9:
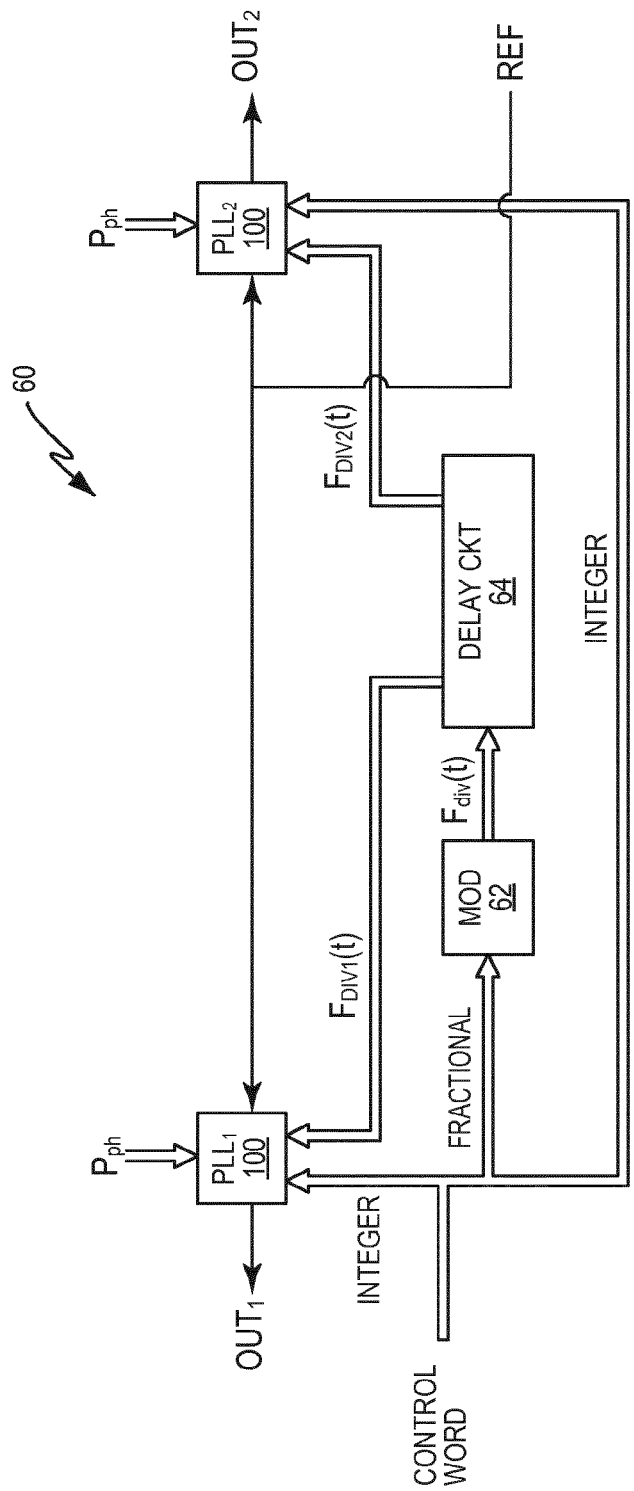
FIG. 9 shows a frequency control circuit according to one exemplary embodiment.

The digital phase control solution presented herein improves the accuracy of the phase control of a PLL 100, at the cost of introducing a new quantization noise source into the corresponding frequency control system. It will be appreciated that the phase control solution disclosed herein may be used with any frequency control systems that also implement some form of quantization noise reduction. For example, FIG. 9 shows an exemplary block diagram for a programmable frequency control system 60 that makes the quantization noise for different PLL output signals independent, and therefore, reduces the effective quantization noise of the frequency control system 60. For simplicity, FIG. 9 shows N=2 PLLs 100. It will be appreciated, however, that any number of PLLs 100 may be included in the frequency control system 60. The frequency control system 60 of FIG. 9 comprises a modulation circuit 62 and a delay circuit 64, where modulation circuit 62 differs from that used for phase control. The delay circuit 64 enables the generation of decorrelated data streams, and thus the generation of PLL output signals with independent quantization noise, even when only one modulation circuit 62 is used to generate the modulated data stream. In the embodiment of FIG. 9, the modulation circuit 62 is configured to generate a (e.g., first) modulated data stream $F_{div}(t)$ based on, e.g., the fractional part of a frequency control word input to the modulation circuit 62, and provide the modulated data stream $F_{div}(t)$ to the delay circuit 64. Delay circuit 64 is configured to provide delayed versions of the modulated data stream to the corresponding PLLs 100, e.g., by time shifting the modulated data stream to generate the time-shifted data streams applied to at least some of the PLLs 100. For example, delay circuit 64 may generate and apply a first data stream $F_{div1}(t)=F_{div}(t-\Delta t_1)$ to PLL$_1$ 100 by essentially applying a time shift of $\Delta t_1$ to the modulated data stream $F_{div}(t)$ output by the modulation circuit 62. In some embodiments, $\Delta t_1=0$, while in other embodiments, $\Delta t_1>0$. Delay circuit 64 may further shift the first modulated data stream to generate a second data stream $F_{div2}(t)=F_{div}(t-\Delta t_2)$, where $\Delta t_2>\Delta t_1$, and apply the second data stream to PLL$_2$ 100. As a result, the fractional portions of the frequency control word used to control the PLLs 100 are decorrelated, which reduces the effective quantization noise of the multi-antenna transmitter and/or receiver. In exemplary embodiments, the modulation circuit 62 comprises a delta-sigma modulator, and the delay circuit 64 comprises a shift register.

The solution presented herein discloses delaying a fraction of the pulses, e.g., one or more pulses, of a PLL feedback signal to generate a desired phase shift at the output of the PLL 100. It will be appreciated that in some embodiments, such delay operations are implemented in a random fashion so as to avoid creating spurious tones in the PLL output signal. Further, by using a delta-sigma modulator as part of the phase control circuit 140, as disclosed herein, any high frequency spurious tones may be attenuated by the low-pass characteristic transfer function of the PLL.

The digital phase control solution presented herein improves the accuracy and resolution of PLL phase control over conventional analog techniques. Further, such a digital implementation requires a smaller chip area, and eases porting of the design to different semiconductor processes.

Various elements disclosed herein are described as some kind of circuit, e.g., a phase control circuit, a modulation circuit, a frequency control circuit, delay circuit, etc. Each of these circuits may be embodied in hardware and/or in software (including firmware, resident software, microcode, etc.) executed on a controller or processor, including an application specific integrated circuit (ASIC). Further, the solution presented herein may be implemented as part of a computer program product comprising software instructions, which when run on a processing circuit, causes the processing circuit to control the PLL as disclosed herein.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A phase-locked loop (PLL) comprising:
   an oscillator configured to generate a PLL output signal at an output of the PLL responsive to a reference signal input to the PLL;
   a detector configured to compare the reference signal to a feedback signal to control a frequency of the PLL output signal, the feedback signal derived by a feedback path of the PLL from the PLL output signal; and
   a phase control circuit operatively connected to the feedback path of the PLL, said phase control circuit configured to generate a timing control signal responsive to a phase control signal, wherein application of the timing control signal to the feedback path shifts a timing of one or more pulses of the feedback signal to achieve a desired average time shift to generate a desired phase shift at the output of the PLL while maintaining a desired average divisor of the feedback signal;
   wherein the phase control circuit comprises:
      a modulation circuit configured to generate a modulated output responsive to the phase control signal; and a filter operatively connected to an output of the modulator and configured to filter the modulated output to generate the timing control signal; and wherein the feedback path of the PLL comprises:
a combiner configured to combine the timing control signal with an input frequency divisor to generate a modified frequency divisor; and
a frequency divider configured to divide the frequency of the PLL output signal by the modified frequency divisor such that one or more pulses of the resulting feedback signal are time shifted while the desired average divisor of the feedback signal is maintained; and wherein the filter comprises:
a delay element configured to delay the modulated output to generate a delayed modulated output; and
a second combiner configured to subtract the delayed modulated output from the modulated output to generate the timing control signal.

2. The PLL of claim 1 wherein the feedback path of the PLL comprises:
a frequency divider configured to divide the frequency of the PLL output signal by a frequency divisor;
a multiplexer controlled by the timing control signal, the multiplexer comprising a multiplexer output operatively connected to the detector and a plurality of multiplexer input connections; and
a delay line comprising a plurality of serially connected delay elements operatively connected between the frequency divider and the multiplexer, said plurality of multiplexer input connections comprising an output of the frequency divider and an output of at least some of the plurality of delay elements;
wherein the multiplexer is configured to periodically select, responsive to the timing control signal, the signal at one of the plurality of multiplexer inputs as the feedback signal.

3. The PLL of claim 2 wherein the phase control circuit comprises a modulation circuit configured to generate the timing control signal responsive to the phase control signal.

4. A method of controlling a phase at an output of a phase-locked loop (PLL) to achieve a desired phase shift at the output of the PLL, the method comprising:
generating a PLL output signal at the output of the PLL responsive to a reference signal input to the PLL;
comparing the reference signal to a feedback signal in a detector to control a frequency of the PLL output signal, the feedback signal derived by a feedback path of the PLL from the PLL output signal;
generating a timing control signal responsive to a phase control signal; and
shifting a timing, responsive to the timing control signal, of one or more pulses of the feedback signal to achieve a desired average time shift to generate a desired phase shift at the output of the PLL while maintaining a desired average divisor of the feedback signal;
wherein generating the timing control signal comprises:
generating a modulated output responsive to the phase control signal; and
filtering the modulated output to generate the timing control signal;
wherein shifting the timing of the one or more pulses of the feedback signal comprises:
combining the filtered modulated output with an input frequency divisor to generate a modified frequency divisor; and
dividing the frequency of the PLL output signal by the modified frequency divisor such that the one or more pulses of the feedback signal are time shifted while the desired average divisor of the feedback signal is maintained; and
wherein filtering the modulated output comprises:
delaying the modulated output by one reference signal period to generate a delayed modulated output; and
subtracting the delayed modulated output from the modulated output to generate the filtered modulated output.

5. The method of claim 4 further comprising:
dividing, in a frequency divider, the frequency of the PLL output signal by a frequency divisor; and
generating a plurality of multiplexer signal inputs by delaying an output of the frequency divider using a plurality of serially connected delay elements, said plurality of multiplexer signal inputs comprising the output of the frequency divider and an output of at least some of the plurality of delay elements;
wherein shifting the timing of the one or more pulses of the feedback signal comprises periodically selecting, responsive to the timing control signal, one of the plurality of multiplexer signal inputs as the feedback signal.

6. A computer program product stored in a non-transitory computer readable medium for controlling a phase at an output of a phase-locked loop (PLL) to achieve a desired phase shift at the output of the PLL, the computer program product comprising software instructions which, when run on a processing circuit, causes the processing circuit to:
generate a PLL output signal at the output of the PLL responsive to a reference signal input to the PLL;
compare the reference signal to a feedback signal in a detector to control a frequency of the PLL output signal, the feedback signal being derived by a feedback path of the PLL from the PLL output signal;
generate a timing control signal responsive to a phase control signal; and
shift a timing, responsive to the timing control signal, of one or more pulses of the feedback signal to achieve a desired average time shift to generate a desired phase shift at the output of the PLL while maintaining a desired average divisor of the feedback signal;
wherein the generation of the timing control signal comprises:
generating a modulated output responsive to the phase control signal; and
filtering the modulated output to generate the timing control signal;
wherein the shifting of the timing of the one or more pulses of the feedback signal comprises:
combining the filtered modulated output with an input frequency divisor to generate a modified frequency divisor; and
dividing the frequency of the PLL output signal by the modified frequency divisor such that the one or more pulses of the feedback signal are time shifted while the desired average divisor of the feedback signal is maintained; and
wherein the filtering of the modulated output comprises:
delaying the modulated output by one reference signal period to generate a delayed modulated output; and
subtracting the delayed modulated output from the modulated output to generate the filtered modulated output.

* * * * *